(12) United States Patent
Englund

(10) Patent No.: US 12,019,130 B2
(45) Date of Patent: Jun. 25, 2024

(54) CRYOGENIC INTEGRATED CIRCUITS ARCHITECTURE FOR MULTIPLEXED CHEMICAL-SHIFT NMR

(71) Applicant: Massachusetts Institute of Technology, Cambridge, MA (US)

(72) Inventor: Dirk Robert Englund, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 339 days.

(21) Appl. No.: 17/465,895

(22) Filed: Sep. 3, 2021

(65) Prior Publication Data

US 2022/0137169 A1 May 5, 2022

Related U.S. Application Data

(60) Provisional application No. 63/108,950, filed on Nov. 3, 2020.

(51) Int. Cl.
*G01R 33/46* (2006.01)
*G01R 33/28* (2006.01)
(Continued)

(52) U.S. Cl.
CPC .......... *G01R 33/46* (2013.01); *G01R 33/282* (2013.01); *G01R 33/31* (2013.01); *G01R 33/323* (2013.01)

(58) Field of Classification Search
CPC ................ G01R 33/00; G01R 33/0035; G01R 33/0023; G01R 33/0017; G01R 31/3191;
(Continued)

(56) References Cited

U.S. PATENT DOCUMENTS 10,705,163 B2   7/2020   Barry et al.
10,962,610 B2   3/2021   Ibrahim et al.
(Continued)

FOREIGN PATENT DOCUMENTS

WO   2019108781 A1   6/2019

OTHER PUBLICATIONS

Abrams et al., "Dynamic nuclear spin polarization of liquids and gases in contact with nanostructured diamond." Nano Letters 14.5 (2014): 2471-2478.
(Continued)

*Primary Examiner* — Jermele M Hollington
*Assistant Examiner* — Taqi R Nasir
(74) *Attorney, Agent, or Firm* — Smith Baluch LLP

(57) ABSTRACT

Chemical-shift nuclear magnetic resonance (NMR) spectroscopy involves measuring the effects of chemical bonds in a sample on the resonance frequencies of nuclear spins in the sample. Applying a magnetic field to the sample causes the sample nuclei to emit alternating current magnetic fields that can be detected with color centers, which can act as very sensitive magnetometers. Cryogenically cooling the sample increases the sample's polarization, which in turn enhances the NMR signal strength, making it possible to detect net nuclear spins for very small samples. Flash-heating the sample or subjecting it to a magic-angle-spinning magnetic field (instead of a static magnetic field) eliminates built-in magnetic field inhomogeneities, improving measurement sensitivity without degrading the sample polarization. Tens to hundreds of small, cryogenically cooled sample chambers can be integrated in a semiconductor substrate interlaced with waveguides that contain color centers for optically detected magnetic resonance measurements of the samples' chemical-shift NMR frequencies.

20 Claims, 11 Drawing Sheets

(51) Int. Cl.
    *G01R 33/31*     (2006.01)
    *G01R 33/32*     (2006.01)
(58) Field of Classification Search
    CPC .............. G01R 33/0358; G01R 33/0356;
        G01R 33/46; G01R 33/282; G01R 33/31;
        G01R 33/323; G01B 7/004; G01C 17/38;
            G06F 3/017; G06F 3/0346; G06F 3/012;
                                            H01L 39/223
    See application file for complete search history.

(56) References Cited

U.S. PATENT DOCUMENTS

| | | | |
|---|---|---|---|
| 10,962,611 B2 | 3/2021 | Barry et al. | |
| 2005/0122115 A1* | 6/2005 | Maguire | G01R 33/345 324/322 |
| 2010/0308813 A1* | 12/2010 | Lukin | G01R 33/1284 324/244.1 |
| 2015/0008917 A1* | 1/2015 | Kentgens | G01R 33/48 324/307 |
| 2019/0178958 A1* | 6/2019 | Barry | G01R 33/3678 |
| 2019/0235031 A1* | 8/2019 | Ibrahim | G11C 13/06 |
| 2020/0064419 A1* | 2/2020 | Barry | G01R 33/323 |
| 2021/0255258 A1 | 8/2021 | Barry et al. | |

OTHER PUBLICATIONS

Ateshian et al., "Terahertz Light Sources by Electronic-Oscillator-Driven Second Harmonic Generation in Extreme- Confinement Cavities." arXiv e-prints (2020): arXiv-2009. 19 pages.
Barnaal et al., "Proton spin-lattice relaxation in hexagonal ice." The Journal of Chemical Physics 48.10 (1968): 4614-4618.
Barry et al., "Optical magnetic detection of single-neuron action potentials using quantum defects in diamond." Proceedings of the National Academy of Sciences 113.49 (2016): 14133-14138.
Barry et al., "Sensitivity optimization for NV-diamond magnetometry." Reviews of Modern Physics 92.1 (2020): 015004. 68 pages.
Bradley et al., "A ten-qubit solid-state spin register with quantum memory up to one minute." Physical Review X 9.3 (2019): 031045. 12 pages.
Bucher et al., "Quantum diamond spectrometer for nanoscale NMR and ESR spectroscopy," arXiv:1905.11099, May 27, 2019 (50 pages).
Castaño et al., "Fabrication of an Etched Silicon Platform with Applications in Uniform Dissection of Biological Samples." Project report, ENGR 241, Stanford University (2020). 27 pages.
Cohen et al., "Confined nano-NMR spectroscopy using NV centers," arXiv:2006.12115v1 [quant-ph], Jun. 22, 2020 (31 pages).
Concistrè et al., "Freezing of molecular motions probed by cryogenic magic angle spinning NMR." The Journal of Physical Chemistry Letters 5.3 (2014): 512-516.
Ebrahimi et al., "Superconducting radio-frequency resonator in magnetic fields up to 6 T." Review of Scientific Instruments 87.7 (2016): 075110. 7 pages.
Eisenach et al., "Cavity quantum electrodynamic readout of a solid-state spin sensor." arXiv preprint arXiv:2003.01104 (2020). 8 pages.
Fox et al., "Part-per-million quantization and current-induced breakdown of the quantum anomalous Hall effect." Physical Review B 98.7 (2018): 075145. 10 pages.
Glenn et al., "High-resolution magnetic resonance spectroscopy using a solid-state spin sensor." Nature 555.7696 (2018): 351-354.
Hart et al., "NV-Diamond Magnetic Microscopy using a Double Quantum 4-Ramsey Protocol," arXiv:2009.02371v1 [quant-ph] Sep. 4, 2020 (9 pages).
Henshaw et al., "Carbon-13 dynamic nuclear polarization in diamond via a microwave-free integrated cross effect." Proceedings of the National Academy of Sciences 116.37 (2019): 18334-18340.
Humphreys et al., "Deterministic delivery of remote entanglement on a quantum network." Nature 558.7709 (2018): 268-273.
Kim et al., "A CMOS-integrated quantum sensor based on nitrogen-vacancy centres." Nature Electronics 2.7 (2019): 284-289.
Lovchinsky et al., "Nuclear magnetic resonance detection and spectroscopy of single proteins using quantum logic." Science 351.6275 (2016): 836-841.
Maddux et al., "An improved methodology for multidimensional high-throughput preformulation characterization of protein conformational stability." Journal of Pharmaceutical Sciences 101.6 (2012): 2017-2024.
Polakovic et al., "Superconducting nanowires as high-rate photon detectors in strong magnetic fields." Nuclear Instruments and Methods in Physics Research Section A: Accelerators, Spectrometers, Detectors and Associated Equipment 959 (2020): 163543. 11 pages.
Polenova et al., "Magic angle spinning NMR spectroscopy: a versatile technique for structural and dynamic analysis of solid-phase systems." Analytical Chemistry (2015): 5458-5469.
Qi et al., "Current-Induced Spin Polarization in Nonmagnetic Semiconductors," Journal of Superconductivity and Novel Magnetism (2019) 32:109-114.
Rosen et al., "Absence of strong localization at low conductivity in the topological surface state of low-disorder Sb 2 Te 3." Physical Review B 99.20 (2019): 201101. 6 pages.
Rosen et al., "Chiral transport along magnetic domain walls in the quantum anomalous Hall effect." npj Quantum Materials 2.1 (2017): 1-6.
Stanfield et al., "CMOS-compatible, piezo-optomechanically tunable photonics for visible wavelengths and cryogenic temperatures." Optics Express 27.20 (2019): 28588-28605.
Tanji-Suzuki et al., "Interaction between atomic ensembles and optical resonators: Classical description." Advances In Atomic, Molecular, and Optical Physics 60 (2011): 201-237.
U.S. Appl. No. 17/376,234, "Absorption-Based Diamond Spin Microscopy on a Plasmonic Quantum Metasurface," to Kim et al., filed Jul. 15, 2021.
Wan et al., "Large-scale integration of artificial atoms in hybrid photonic circuits." Nature 583.7815 (2020): 226-231.
Wan et al., "Large-scale integration of near-indistinguishable artificial atoms in hybrid photonic circuits." arXiv preprint arXiv:1911.05265 (2019). 11 pages.

* cited by examiner

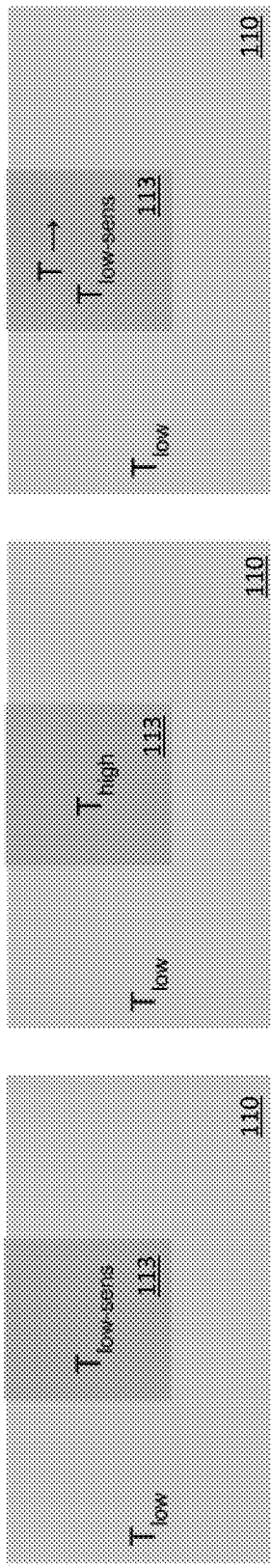

CRYOGENIC INTEGRATED CIRCUITS ARCHITECTURE FOR MULTIPLEXED CHEMICAL-SHIFT NMR

CROSS-REFERENCE TO RELATED APPLICATION(S)

This application claims the priority benefit, under 35 U.S.C. 119(e), of U.S. Application No. 63/108,950, which was filed on Nov. 3, 2020, and which is incorporated herein by reference for all purposes.

GOVERNMENT SUPPORT

This invention was made with government support under W911NF-15-1-0548 awarded by the U.S. Army Research Office and OAC1839159 awarded by the National Science Foundation. The government has certain rights in the invention.

BACKGROUND

Nuclear magnetic resonance (NMR) spectroscopy is an analytical technique with applications spanning chemistry, biology, physics, materials, space exploration, homeland security, and geosciences. In NMR spectroscopy, a sample is placed in a magnetic field, and radio-frequency (RF) or microwave radiation probes the resonance frequencies of the atomic nuclei in the sample. The intramolecular magnetic field around each atom in the sample changes the resonance frequency. These changes reveal details of the electronic structure of the molecules in the sample and their functional groups. In chemical NMR spectroscopy, these changes represent the effect of chemical bonds on NMR frequency. Chemical NMR spectroscopy can be used to provide quantitative compositional information of samples.

SUMMARY

Because conventional (chemical) NMR signals are typically very weak, they must be integrated over long times and/or over large sample volumes. This makes conventional chemical NMR spectroscopy unsuitable for measuring fast changes in small samples. For instance, conventional chemical NMR spectroscopy cannot be used to study cell dynamics, such as respiration, in cell-sized volumes because the achievable signal-to-noise ratio (SNR) is too low.

Fortunately, the present technology can be used to extend chemical NMR techniques to ever smaller sample volumes, with a particular focus to enable compositional analysis of single cells and even single molecules. Because typical inductive NMR readout techniques become infeasible as the SNR diminishes with the molecule quantity, the present techniques are based on optically detected magnetic resonance (ODMR) of color centers in solids, for example, nitrogen vacancy (NV) centers in diamond. The present technology enables several orders of magnitude gains in NMR sensitivity, pushing these below the level of fmole/$\sqrt{Hz}$.

An inventive NMR may include a complementary metal oxide semiconductor (CMOS) substrate, a sample chamber formed in or on the CMOS substrate, a cryostat in thermal communication with the sample chamber, and a color center in electromagnetic communication with the sample. In operation, the sample chamber holds a sample, which the cryostat cools to a cryogenic temperature (e.g., 4 K or below). And the color center senses an NMR signal generated by at least one nuclear spin in the sample.

The sample chamber's volume can be no more than 1000 $\mu m^3$. In some cases, the sample chamber is in an array of sample chambers formed in or on the CMOS substrate. The color center can be formed in an optical waveguide configured to guide a pump beam to the color center.

The sensor may include a conductive coil, in electromagnetic communication with the color center, to apply a time-varying magnetic field to the color center. This conductive coil can be configured (with other magnetic field sources, if appropriate) to rotate the time-varying magnetic field at a magic angle with respect to the sample.

The NMR sensor can also include a photodetector in optical communication with the color center. This photodetector detects fluorescence that is emitted by the color center with a spectrum including a resonance shift caused by the NMR signal.

The NMR sensor can include a radiation source (e.g., a laser), in electromagnetic communication with the sample, to flash heat at least a portion of the sample. There may be a microfluidic channel, in fluid communication with the sample chamber, to convey the sample to the sample chamber. And the NMR sensor can have a reservoir to hold a hyperpolarized liquid and a valve, in fluid communication with the sample chamber and the reservoir, to admit at least a portion of the hyperpolarized liquid into the sample chamber for hyperpolarizing the sample.

An inventive method of measuring NMR of a sample may include cryogenically cooling a sample in a cavity formed in a substrate. Once the sample is cooled, motional averaging is induced in the sample while a magnetic field is applied to the sample. Performing an ODMR measurement of a color center disposed in the cavity and at least partially surrounded by the sample yields an output representing an alternating current (AC) magnetic field generated by at least one nuclear spin in the sample in response to the magnetic field.

Inducing motional averaging in the sample while applying the magnetic field to the sample may include flash heating at least a portion the sample and/or applying the magnetic field as a magic angle spinning magnetic field.

Performing the ODMR measurement may include coupling at least one pump pulse into a waveguide containing the color center and extending into the cavity; applying a microwave field to the color center; and measuring fluorescence emitted by the color center in response to the pump pulse(s) and the microwave field.

If desired, the sample can be hyper-polarized, e.g., by flash-heating the sample to a liquid state and, while the sample is flash-heated to the liquid state, mixing the sample with a pre-polarized liquid. Alternatively, hyper-polarizing the sample may include injecting spin-polarized current into the sample.

Another inventive NMR sensor includes a substrate and an array of sensing unit cells integrated into the substrate. Each of these sensing unit cells includes a sample chamber, waveguide, microwave coil, and photodetector. Each sample chamber has a volume of no more than 1000 $\mu m^3$ and is configured to hold a cryogenically cooled sample having nuclei that emit alternating current (AC) magnetic fields in response to an applied magnetic field. Each waveguide contains a color center and extends into the corresponding sample chamber and is configured to guide pump light to that color center. Each microwave coil is in electromagnetic communication with the corresponding sample chamber and is configured to apply a microwave field to the corresponding color center. And each photodetector is in optical communication with the corresponding color center and is configured to detect fluorescence emitted by that color center. This fluorescence represents the AC magnetic fields emitted by the nuclei in the cryogenically cooled sample in the corresponding sample chamber. The NMR sensor can also a radiation source in optical communication with at least one of the samples and configured to flash-heat that sample. And each sensing unit cell in the array of sensing unit cells can include a reservoir configured to hold a hyperpolarized liquid and a valve that is in fluid communication with the sample chamber and the reservoir and is configured to admit the hyperpolarized liquid into the sample chamber for hyperpolarizing the sample.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

Figures 1A, 1B, 1C:
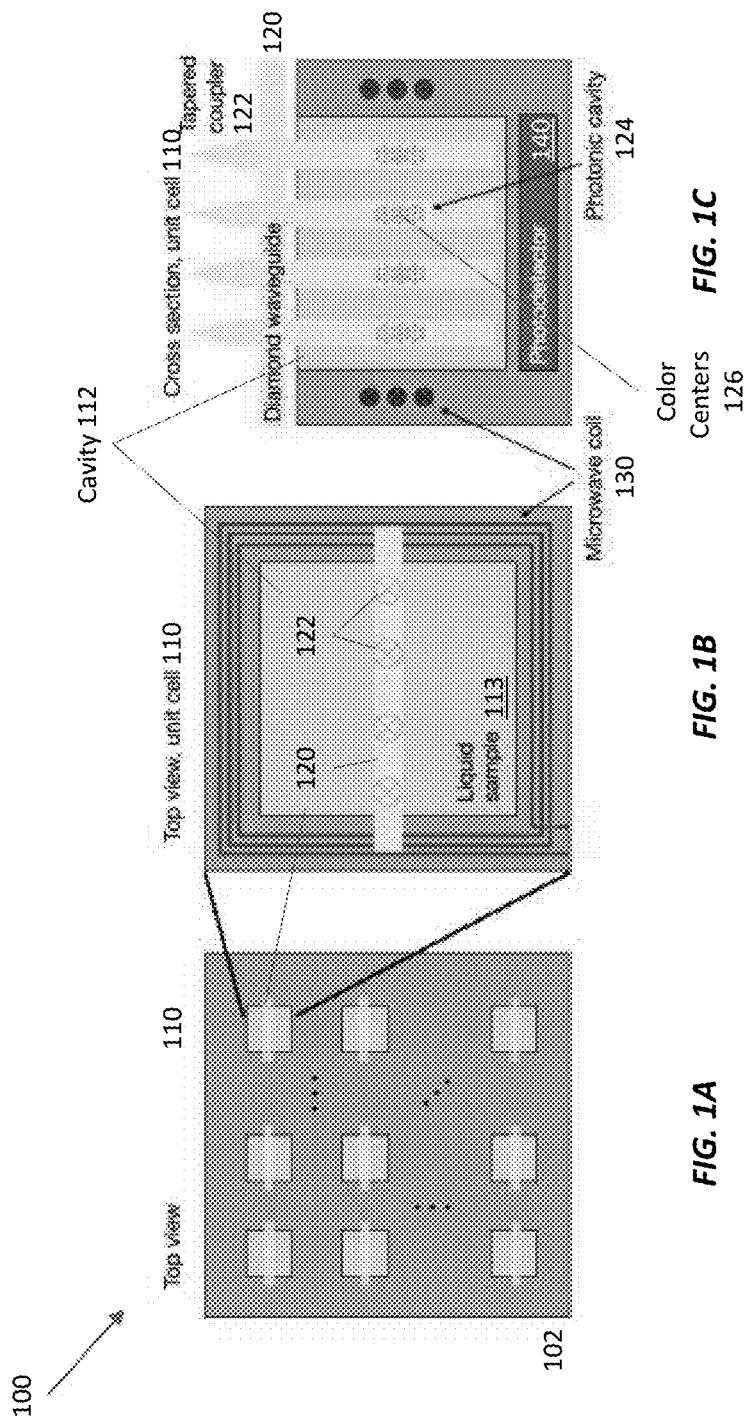
FIG. 1A shows a top view of an array of sensing unit cells inside an integrated circuit (IC) platform.
FIG. 1B shows a top view of a sensing unit cell in the array of FIG. 1A.
FIG. 1C shows a side view of the sensing unit cell of FIGS. 1B and 1C.
Figure 2:
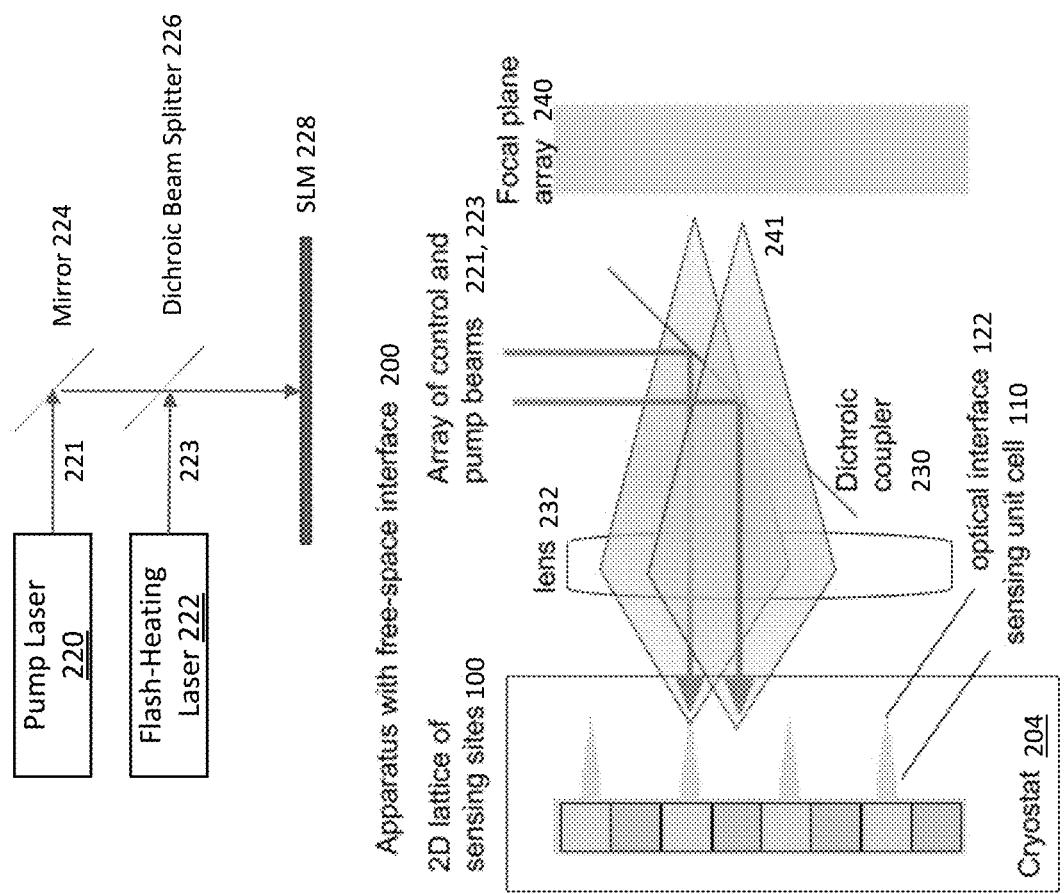

FIG. 2 illustrates a free-space configuration with an integrated circuit (IC)-diamond sensing chip (e.g., as in FIG. 1A) that is in a cryostat and optically addressed from outside the cryostat using arrays of beams (which can be produced by, for example, one or more spatial light modulators (SLMs)) and is imaged onto a detector array (such as a focal-plane array) for optically detected magnetic resonance (ODMR) measurements.

Figure 3A:
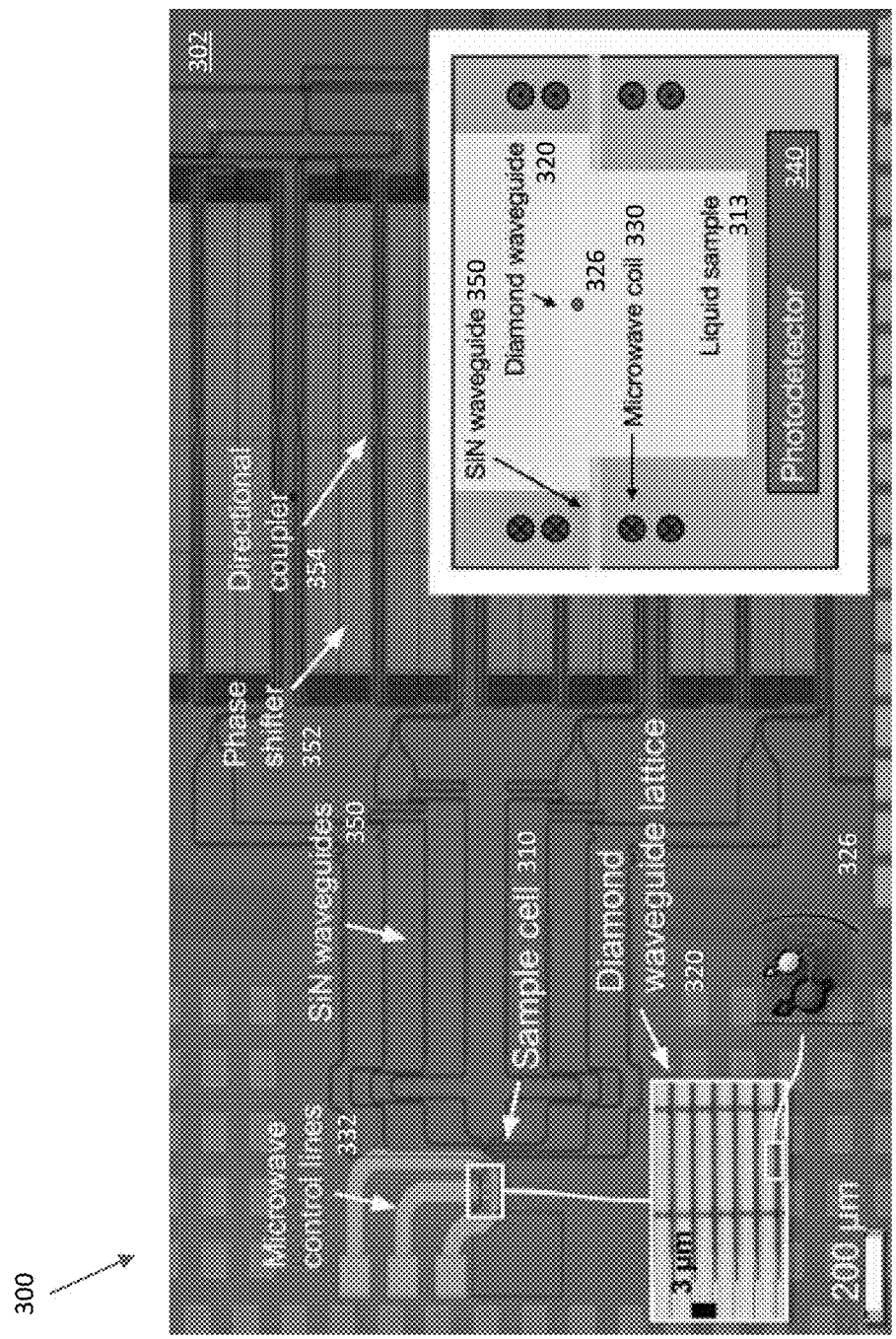

FIG. 3A shows a top view of a photonic integrated circuit (PIC) module with integrated waveguides that deliver optical fields to an array of sensing unit cells and chip-integrated photodetectors for ODMR measurements (the inset shows a side view of a sensing cell).

Figures 3B, 3C:
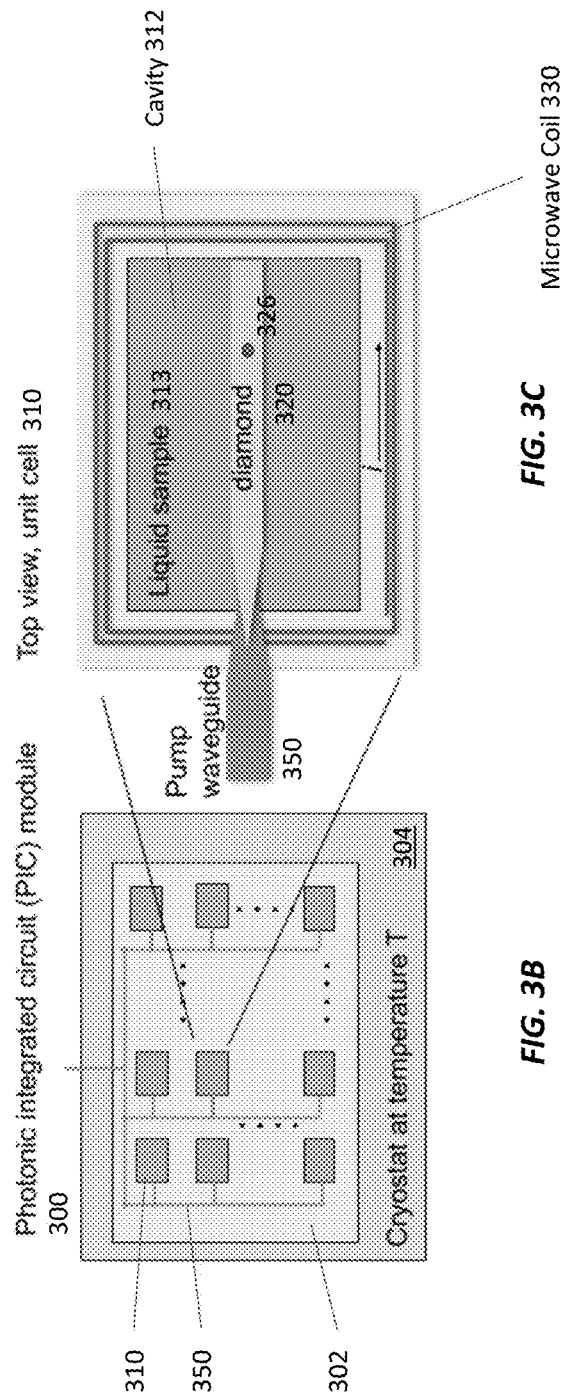

FIG. 3B shows a top view of a diamond module or chiplet with an array of sensing unit cells that can be integrated into the PIC of FIG. 3A.

FIG. 3C shows a top view of an integrated sensing unit cell in the diamond chiplet of FIG. 3B.

Figure 4B:
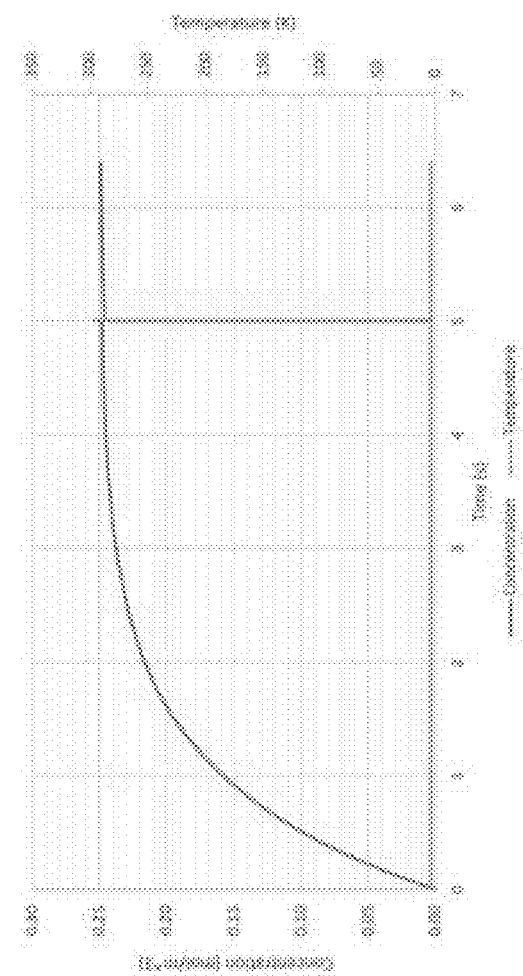
Figure 4A:
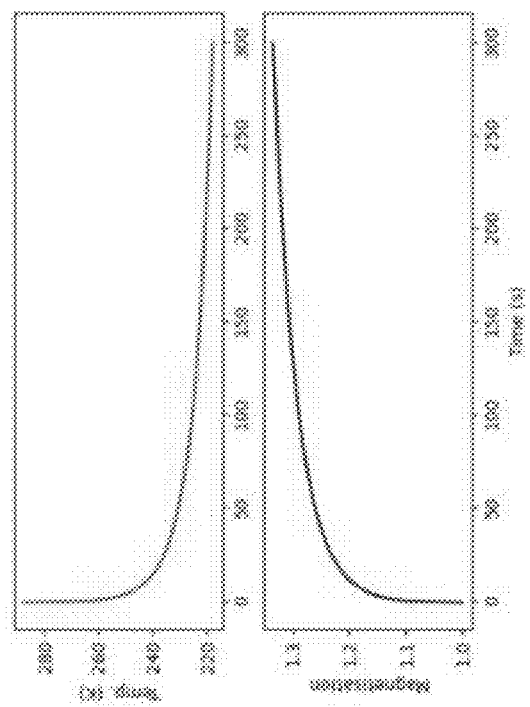

FIG. 4A is a plot of concentration (left axis) and temperature (right axis) versus time for a flash-heated sample in a sensing unit cell.

FIG. 4B shows temperature (upper plot) and magnetization (lower plot) versus time.

FIGS. 5A-5C illustrate flash heating for motional narrowing NMR under cryogenic conditions.

Figure 6:
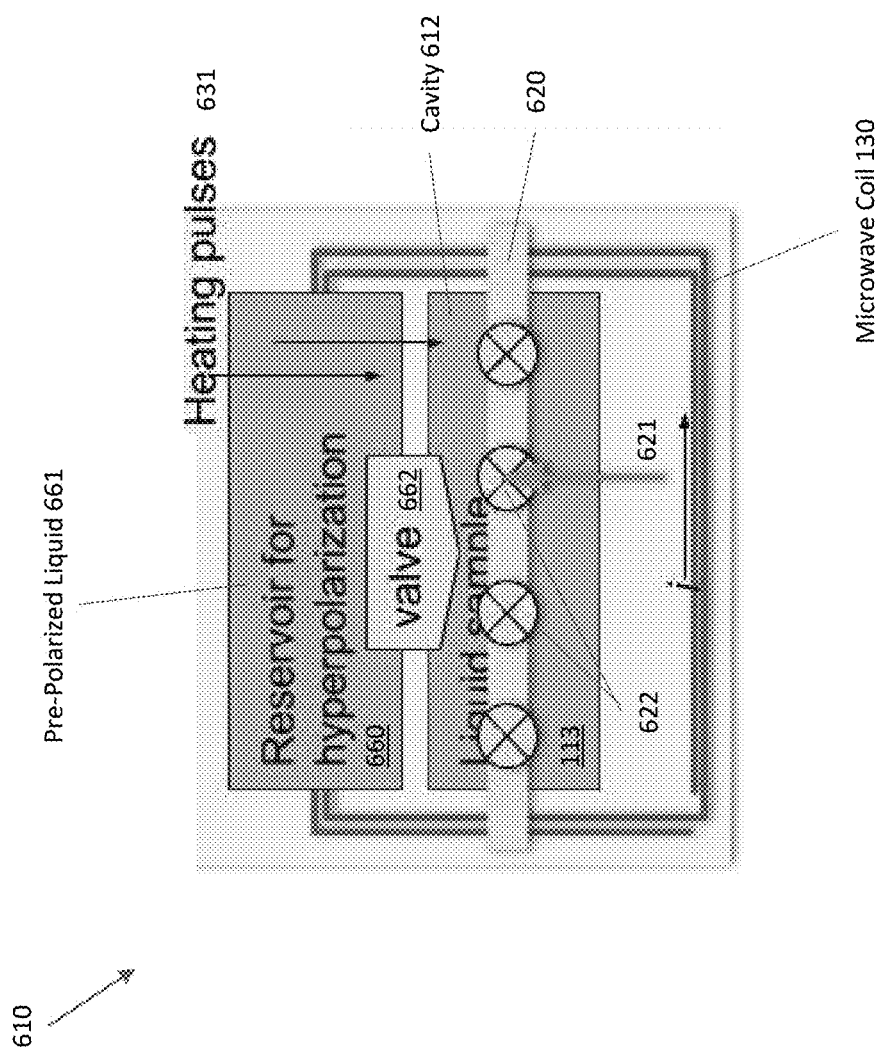

FIG. 6 shows a reservoir of hyperpolarized spins near the sensing unit cells in FIG. 1A that can be used to rapidly spin-polarize the small-volume samples.

Figures 7A, 7B:
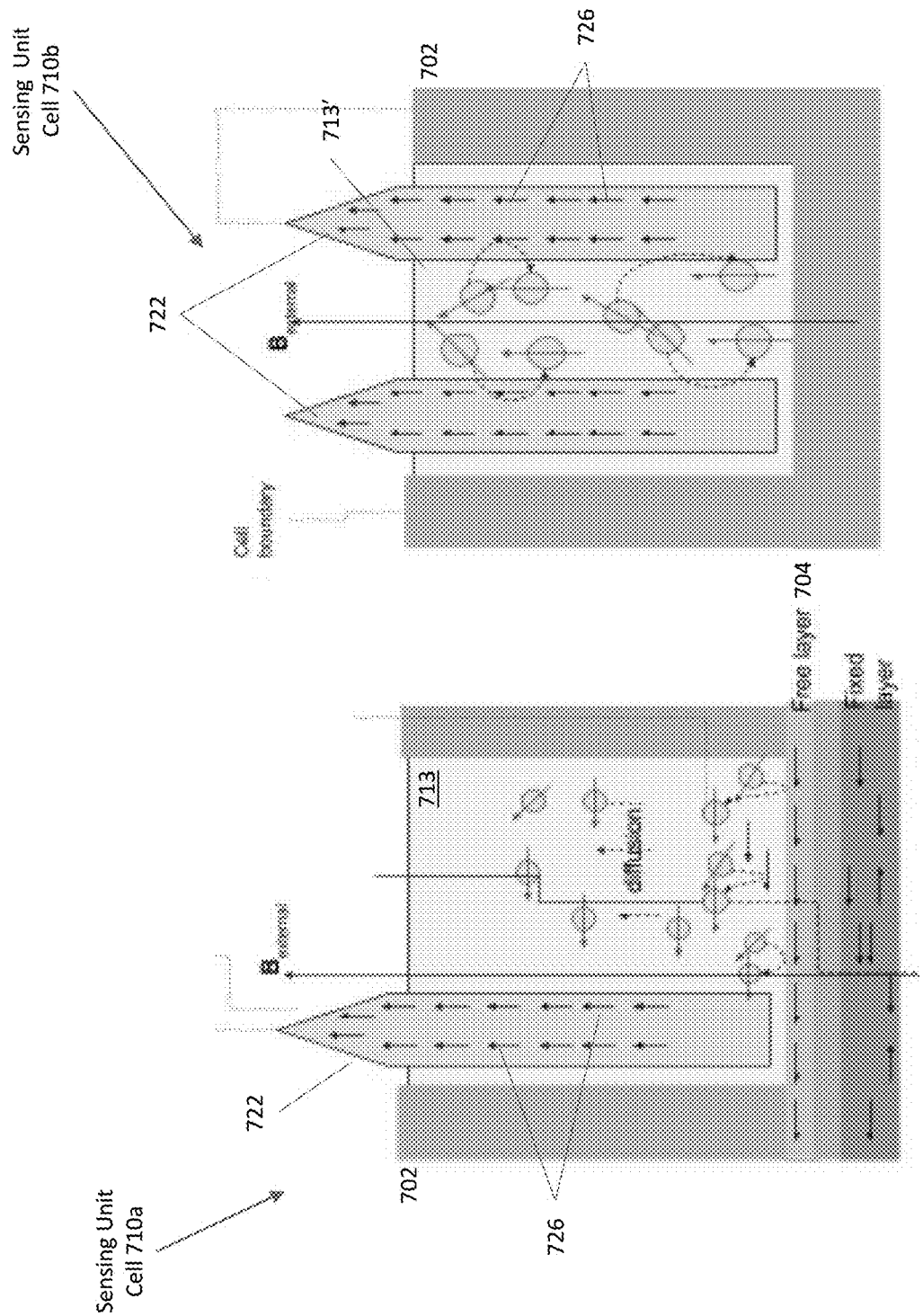

FIG. 7A shows a sensing unit cell in which a spin-polarized current polarizes nuclei in a flash-heated sample.

FIG. 7B shows a sensing unit cell in which spin-polarized color centers polarize nuclei in a flash-heated sample.

Figure 8:
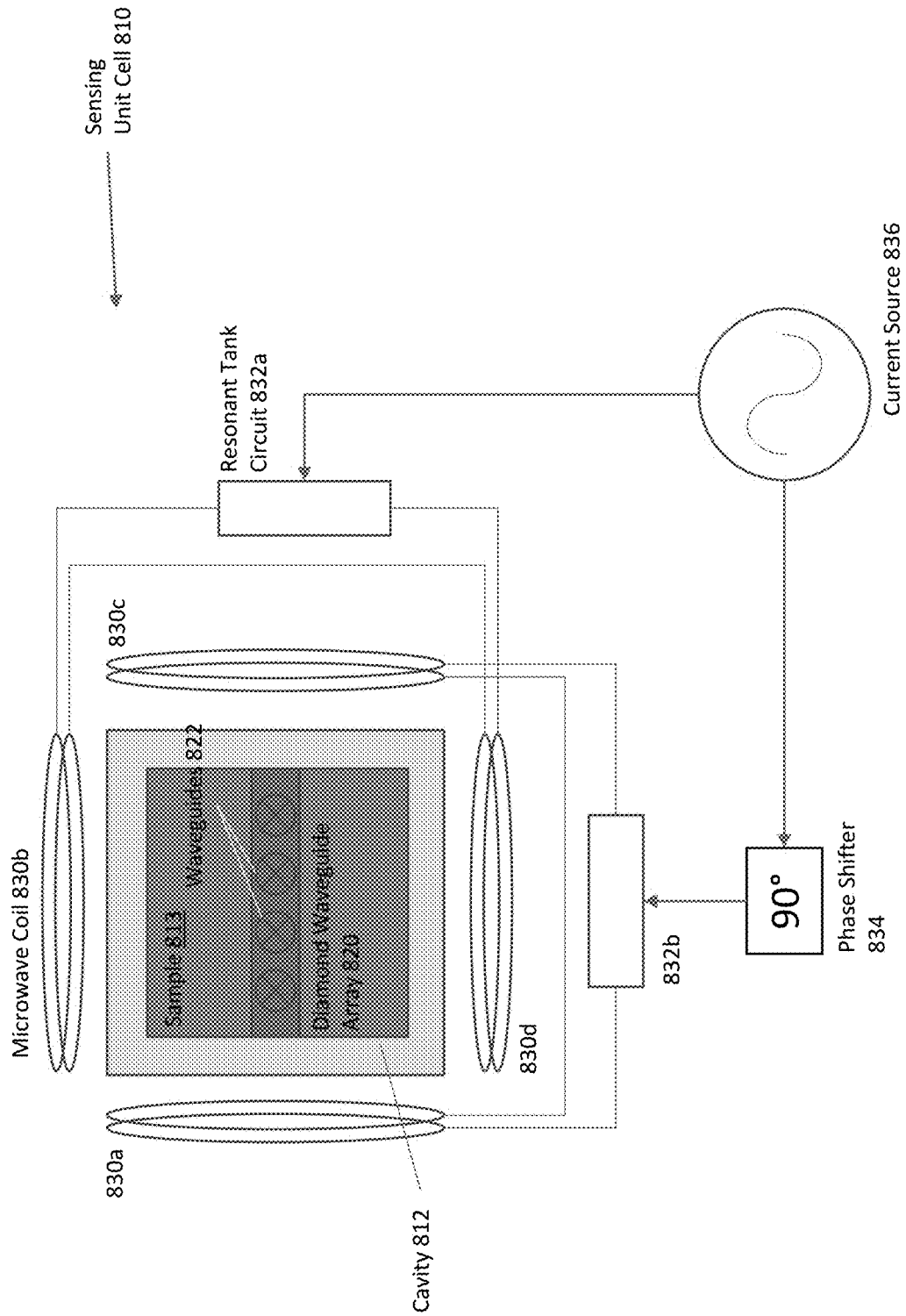

FIG. 8 shows a sensing unit cell with microwave coils configured to subject the sample to a magic angle spinning magnetic field for motional averaging.

Figures 9A, 9B:
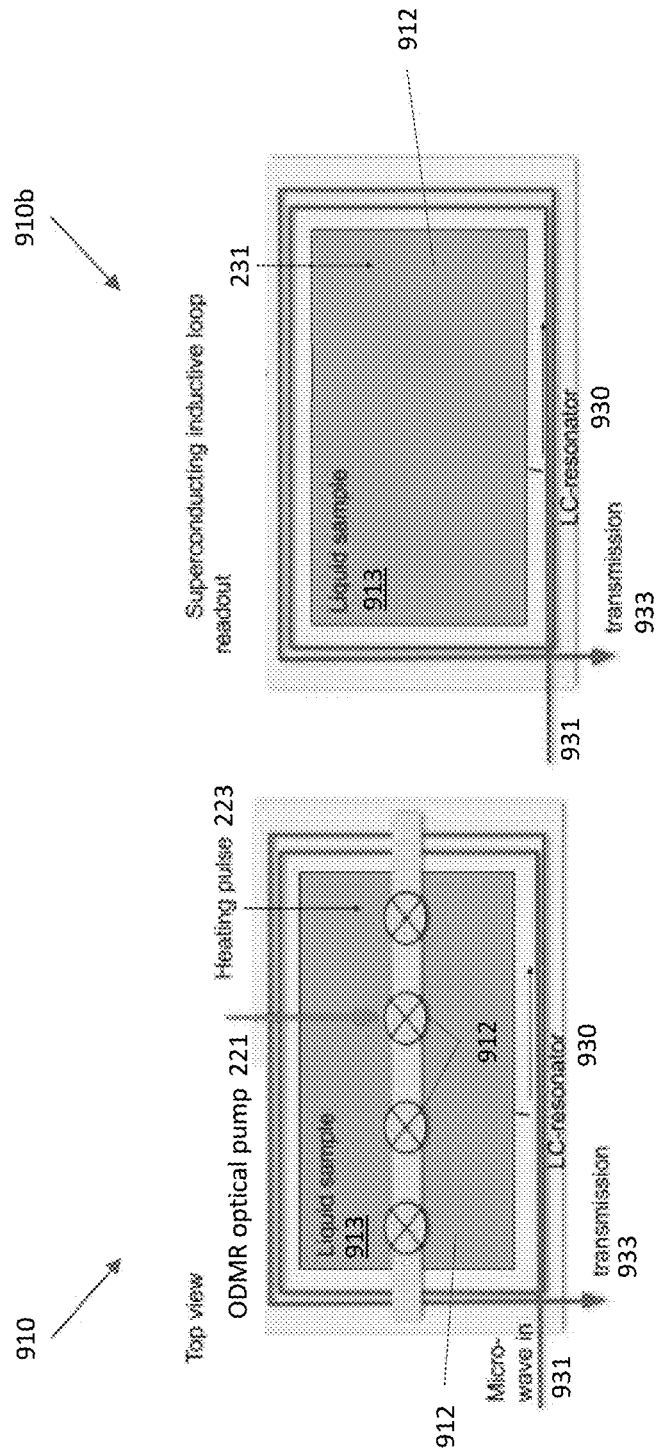

FIG. 9A illustrates microwave readout by spin-dependent scattering from optically polarized NV centers at least partially surrounded by a flash-heated liquid sample.

FIG. 9B illustrates direct inductive readout from a flash-heated liquid sample.

Figure 10:
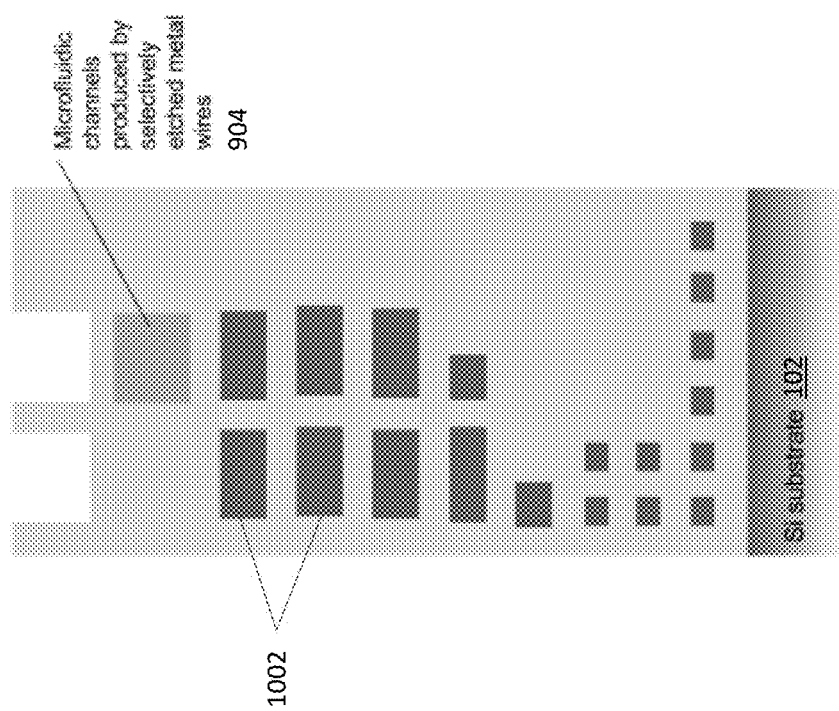

FIG. 10 shows microfluidic channels in a complementary metal oxide semiconductor (CMOS) chip that can deliver and exchange liquids (e.g., samples or hyperpolarized liquids) to and from integrated sensing unit cells.

DETAILED DESCRIPTION

Chemical NMR spectroscopy using color centers, such as nitrogen vacancies (NVs) in diamond, can be used to measure the effects of chemical bonds on NMR frequency in sample volumes that are less than one cubic millimeter in size. The color centers act as magnetometers that make sensitive measurements of the NMR resonance(s) of the nuclei in the sample. These measurements can be used to sense the effects of chemical bonds on the NMR resonance frequencies.

Cooling the sample to cryogenic temperatures (e.g., 4.8 K or below) increases the sample polarization, which in turn increases the net spin to levels high enough to be detected reliably, even for very small (e.g., cell-sized) sample volumes. Unfortunately, most solid samples tend to have built-in magnetic field inhomogeneities that degrade chemical NMR signals. This is why conventional chemical NMR is performed on liquid samples, where motional averaging eliminates magnetic field inhomogeneities.

An inventive diamond NV NMR sensor takes advantage of the high polarization provided by cooling the sample to cryogenic temperatures. It also takes advantage of motional averaging for better sensitivity. Motional averaging can be achieved by flash heating a small volume (e.g., a volume with lateral dimensions of microns to tens of microns) of the cryogenically cooled sample with a pulse of laser or microwave radiation. Alternatively, a liquid sample can be hyperpolarized by cryogenically cooled spin centers (e.g., NVs) that are spin conductive with and thermally isolated from the liquid sample. A liquid sample can also be hyper-polarized by an injected spin-polarized current, with polarized electrons in the current polarizing the nuclei in the sample, potentially reducing the amplitude of the magnitude of the magnetic field for the NMR measurement. Alternatively, motional averaging can be achieved by subjecting a solid sample to a magic-angle-spinning bias magnetic field.

To measure an NMR signal of a sample with an inventive diamond NV sensor, the sample is subject to a permanent or bias magnetic field that causes the nuclear spins in the sample to generate NMR signals, which are alternating (AC) magnetic fields with frequencies between hundreds of kHz and a few MHz. The frequencies of these NMR signals may depend, at least in part, on the chemical bonds of the corresponding molecules. The nuclear spins can be either cryogenically cooled and flash-heated or hyper-polarized in order to increase their polarization while preventing variations in any built-in magnetic fields from degrading the NMR signals. The NMR signals shift the resonances of the NVs. Irradiating the NVs with microwave and optical pulses causes the NVs to emit fluorescent light whose spectrum reveals the resonance shifts caused by the NMR signals.

A diamond NV NMR sensor can be miniaturized and integrated onto a CMOS chip that provides supporting circuitry, including wires and inductors for applying RF or microwave fields to the NVs, channels for flowing liquid samples into and out of the sensor, and/or waveguides for guiding pump light to and fluorescence from the NVs. A CMOS-compatible integrated circuit (IC) may include an array of tens to hundreds to thousands of individual sensors, each of which has diamond NVs or other color-center defects for making NMR measurements of a corresponding sample that can be as small as a single biological cell. Cryogenic operation increases nuclear spin polarization by over two orders of magnitude compared to room temperature while ensuring spin motional averaging by "flash" heating and cooling achieved by Ohmic heating, microwave heating, or an external optical pump. Alternatively, a reservoir of hyperpolarized liquid, co-located with the sample cells, can hyper-polarize the sample(s) to achieve similar increases in nuclear spin polarization while maintaining spin motional averaging in the sample.

The microscopic metal layers of the CMOS substrate, which can be integrated with on-chip current sources, provide efficient high-frequency (e.g., exceeding 100 GHz) microwave and RF sources for nuclear and electron-spin manipulation. Diamond nanostructures in each sensing unit cell further increase optical collection efficiency, especially when combined with IC-integrated photodetectors.

Further, resonant optical readout of NV centers at cryogenic temperatures increases the signal contrast by nearly two orders of magnitude, with a proportional gain in sensitivity; this resonant readout is promising both for the NV spin-triplet transitions near 637 nm and the spin-singlet transition near 1043 nm. Another path to high-contrast NV readout is by microwave scattering from the NV spin ground-state transitions, leveraging the tight CMOS wiring in each sensing unit cell for magnetic field amplification in inductors and cavities, especially when using superconducting conductors. Indeed, in some applications, the compact size, low readout noise, and high quality factors available for superconducting cavities may enable direct inductive readout, without the use of diamond color centers.

The diamond nanostructures are also attractive for dynamic nuclear polarization. To this end, the diamond waveguide edge is patterned for (maximal) polarization transfer from diamond nuclear spins (polarized via NV centers) to the surrounding liquid (the sample). Each patterned diamond nanostructure can serve a dual purpose for cavities or slight-light waveguides.

NMR Measurement Sensitivity

The minimum detectable spin concentration (in the thermodynamic limit, at least) is proportional to the minimum detectable magnetic field. For a simple form of ODMR-based magnetic field sensing—continuous-wave ODMR magnetometry—the sensitivity is given by the slope $\delta P/\delta \omega$ of the optically measured power, P, with respect to angular frequency $\omega$. If the measurement is shot-noise limited by the photon flux R (rather than spin-projection noise limited), the sensitivity is $$\delta B_{CW-ODMR} \approx \hbar \sqrt{R} / (g_e \mu_B \max|\delta P/\delta \omega|) = \frac{8\pi}{3\sqrt{3}} \frac{\hbar}{g_e \mu_B} \frac{\Delta v}{C\sqrt{R}},$$

where $\Delta v$ is the ODMR resonance linewidth (proportional to $$\frac{1}{T_2}),$$

$g_e$ is the gyromagnetic ratio, $\mu_B$ is the Bohr magneton, and C is the resonance line contrast. This improves the continuous-wave (cw) ODMR sensitivity $\eta_{CW-ODMR}$ through a combination of high contrast (e.g., C≈1) and efficient photon collection (fluorescence or transmission). With high contrast and efficient photon collection, the sensor should reach the spin-projection noise-limited sensitivity for N color centers, given by $$\delta B_{CW-ODMR} = \frac{\hbar}{(g\mu_B \sqrt{N\tau T})},$$

where $\tau$ is the spin echo free precession time and T is the integration time. By locking to an external clock, $\tau$ can be as long as T, so $$\delta B_{CW-ODMR} = \frac{\hbar}{(g\mu_B T_2 \sqrt{N})},$$

where $T_2$ is the NV coherence time. Assuming a diamond nanowire of dimensions 300 nm by 300 nm by 10 μm, with an NV density of 2 ppm, the sensitivity can be about 10 fT/Hz$^{1/2}$, assuming diamond properties as reported Hart et al., "NV-Diamond Magnetic Microscopy using a Double Quantum 4-Ramsey Protocol," arXiv:2009.02371v1 [quant-ph] 4 Sep. 2020 (available at https://arxiv.org/pdf/2009.02371.pdf). The sensitivity can be calculated as follows:

ln[40]:=$\hbar$=6.7*10^(−34)/(2π);

μB=9.27*10^(−24);

g=2;

T2=10^−3;

Vol=(300*10^−9)^2(10*10^−6) m^3;

NumNV=(2NVs÷(10^6C12))(C12/(12/(6.3−10^26) kg))(3500 kg/m^3)*Vol

Out[45]=330 750·NVs

+− ln[39]:=$\delta B=\hbar(g*\mu B(Num\ NV/NVs)^{0.5}T2)^{-1}$

Out[39]=1.00008*10$^{-11}$

Free-Space Cryogenic Architecture

FIGS. 1A-1C illustrate an integrated diamond NV NMR sensor system suitable for use in a free-space cryogenic architecture. FIG. 1A shows a top or front view of a CMOS circuit 100 with an array of sensing unit cells 110, also called sensing cells or unit cells, formed in a CMOS substrate 102.

Each sensing unit cell 110 includes a cavity 112, also called a sensing volume or sample chamber, with lateral (e.g., x, y, z) dimensions of order 1-10 μm, depending on the application. These sensing volumes 112 can be fabricated by an opening etch into the CMOS interconnect layer using, for example, plasma etching (dry etching) or wet etching (timed hydrofluoric (HF) acid etch) of oxide, or an etch of sacrificial metal layers (which can be made selective to a particular charged wire through the use of an electrochemical etching process). A single CMOS circuit 110 can accommodate an array with hundreds to thousands of sensing unit cells 110 while still fitting on one centimeter-scale reticle.

FIGS. 1B and 1C show top and side views, respectively, of a single sensing unit cell 110. The cavity 112 in the sensing unit cell 110 holds a liquid sample 113 that can be cooled to cryogenic temperatures and flash-heated for a fast, sensitive chemical-shift NMR measurement. The liquid sample 113 can enter and exit the cavity 112 via microfluidic channels (not shown) formed by removing metal layers or select metal wires in the CMOS substrate 102.

The sensing unit cell 110 includes a central diamond waveguide array 120, or diamond microchiplet 120, that is vertically slotted into the sensing unit cell 110. The diamond waveguide array 120 includes several waveguides 122 that extend into the liquid sample 113 in the cavity 112 in one direction and are tapered in the opposite direction for efficient in- and out-coupling to low-numerical aperture (NA) optical modes (e.g., NA<0.3). Each waveguide 122 in the array 120 also includes a photonic crystal cavity 124 that contains one or more color centers (e.g., NVs) 126, which are positioned along the waveguide 122 so that they are at least partially surrounded by the liquid sample 113. The photonic crystal cavity 124 couples incoming light (e.g., pump pulses for ODMR measurement) to the color centers 126 and transmits fluorescence from the color centers 126 toward to the tapered couplers and/or toward an integrated photodetector.

FIGS. 1B and 1C also shows two wire loops 130 surrounding the sensing unit cell 110. Running an alternating current through these wire loops 130 produces a magnetic field that can modulated at RF or microwave rates for manipulating nuclear spins (RF) and electron spins (microwave) in the sample 113. The magnetic field(s) generated by the wire loops 130 can be used to manipulate the sample 131 and/or the color centers 126. The system 100 may also include or be close to a permanent magnet that applies a DC magnetic field to the sample 131 and/or the color centers 126. The current through the wire loops 130 can be provided through a distributed current supply that serves the entire CMOS circuit 100 and locally amplified or from a separate oscillator for each sensing unit cell 110. Each sensing unit cell 110 may also include an integrated photodetector 140 for sensing spin-dependent fluorescent light emitted by the color centers 126.

FIG. 2 illustrates the CMOS circuit 100 as part of a chemical-shift NMR measurement system 200 with a free-space interface. The CMOS circuit 100 is in a cryostat 204 that cools the liquid samples 113 (and the CMOS circuit 100) to cryogenic temperatures (e.g., 4.8 K or below). The system 200 also includes a pump laser 220, flash-heating laser 222, spatial-light modulator (SLM) 228, and focal plane array 240. In operation, the pump laser 220 generates pump pulses 221 for initializing and reading out the color centers 126 in the diamond waveguides 122 for ODMR measurements. And the flash-heating laser 222 generates flash-heating pulses 223 for temporarily liquefying the samples 113 in the different sensing unit cells 110.

A mirror 224 and a dichroic beam splitter 226 direct the pump pulses 221 and flash-heating pulses 223 toward the SLM 228 (the system may include other or alternative components as well, including lenses and mirrors for shaping and directing these pulses 221 and 223). The SLM 228 modulates the wave fronts of the pump pulses 221 and flash-heating pulses 223, which may be time-multiplexed at a time scale on the order of the SLM modulation rate, so that a lens 232 (e.g., a microscope objective) focuses them to different areas of the CMOS circuit 100: the lens 232 couples the pump pulses 221 into the diamond waveguides 122 and focuses the flash-heating pulses 223 onto the cavities 112 in the sensing unit cells 110 via a dichroic coupler 230. (If desired, the lens 232 can serve as a window in the cryostat 204.)

The pump pulses 221 initialize and manipulate the spins of the color centers 126 in the sensing unit cells 110 for an ODMR measurement of the flash-heated liquid samples 113. In response, the color centers 126 emit spin-dependent fluorescent light 241, which propagates along the diamond waveguides 122 and into free space. The lens 232 focuses the fluorescent light 241 through the dichroic coupler 230 and onto a focal plane array 240 for detection. Measurements by spin-dependent optical fluorescence can also use on-chip p-i-n photodiodes or avalanche photodetectors for readout, using a diamond waveguide-integrated long-pass filter as illustrated in the side view of the sensing unit cell shown in FIG. 1C.

The imaging setup (dichroic coupler 230 and lens 232) in FIG. 2 enables efficient photodetection. The lens 232 couples optical pump pulses 221 to tapered diamond waveguides 122 and collects fluorescence through the same waveguides 122. Alternatively, or in addition, chip-integrated photodetectors (e.g., photodetector 140 in FIG. 1C) can collect fluorescence, using a diamond-integrated long-pass filter that forms part of the photonic crystal cavity 124. Finally, transmission can be measured directly on CMOS-integrated photodetectors in the transistor layer in absorption measurement, e.g., as in U.S. application Ser. No. 17/376,234, entitled "Absorption-Based Diamond Spin Microscopy on a Plasmonic Quantum Metasurface," which is incorporated herein by reference in its entirety.

Operating in the cryostat 204 at cryogenic temperature greatly improves the equilibrium spin polarization in an applied magnetic field, which can be assumed to be oriented out of the sensor plane in the z direction. The polarization of a spin-½ particle in a magnetic field $B_z$ is given by the difference in spin-up and spin-down populations, given by the Boltzmann factor, P. Even for strong magnetic fields, the polarization P<<1, in which regime P can be approximated as $\Delta E/k_B T$, where $\Delta E \propto B_z$ is the Zeeman energy in the magnetic field, $k_B$ is the Boltzmann constant, and T is the sample temperature. Thus, reducing the temperature T from room temperature (300 K) to a typical cryostat temperature (e.g., 3 K) increases the polarization 100-fold, all else being equal. Modern closed-cycle cryostats can readily reach a temperature of 0.3 K without expensive dilution refrigeration technology.

Photonic Integrated Circuit (PIC) Architecture

In many applications, a compact and integrated architecture is advantageous, even if it imposes trade-offs on aspects such as scalability. For example, an integrated architecture is beneficial when portability, ruggedness, or size-weight-and-power (SWaP) matter. To this end, the free-space optical microscope apparatus in FIG. 2 can be exchanged for a photonic integrated circuit (PIC) architecture in which the optical fields are distributed by optical waveguides to the sensing cells.

FIGS. 3A-3C illustrate an example diamond NV NMR sensor integrated into a PIC module 300. FIG. 3A shows a top view of the PIC module 300, with an array of sensing unit cells 310 integrated in or on a CMOS substrate 302. The inset of FIG. 3A shows a profile view of one sensing unit cell 310. FIG. 3B shows a plan view of the PIC module 300 in a cryostat, and FIG. 3C shows a plan view of a single unit cell 310.

The PIC module 300 includes microwave control lines 332 and SiN pump waveguides 322 that are also integrated in or on the substrate 302. The microwave control lines 332 drive the microwave coils 330 surrounding the cavities 312 in the sensing unit cells 310 for applying RF and/or microwave magnetic fields to a sample 313. The integrated pump waveguides 350 couple pump light into the sensing unit cells 310 from one or more on- or off-chip light sources (not shown) for exciting NVs 326 in diamond waveguides 320 running through the sensing unit cells 310. The pump waveguides 350 can be coupled to the light sources via one or more phase shifters 352 and/or directional couplers 354 for distributing the pump pulses as desired among the sensing unit cells 310.

The sensing unit cells 310 can be arranged in an array and held at cryogenic temperature in a cryostat 304. Each sensing unit cell 310 includes a cavity 312 formed in the CMOS substrate 302 to hold a sample 313. This sample 313 can be flash-heated with an optical pulse incident on the sensing unit cell 310 from free space (e.g., at normal or glancing incidence on the PIC module 300).

The inset of FIG. 3A shows a side view of an individual sensing unit cell 310. It includes a diamond waveguide 320 with a tapered end that overlaps a similarly tapered end of a corresponding SiN pump waveguide 350. The diamond waveguide 320 guides pump pulses from the SiN pump waveguide 350 to one or more color centers 326 embedded in the diamond waveguide 320. The diamond waveguide 320 runs through the cavity 312 as well as through the sample 313 contained within the cavity 312. For fluorescence readout, a CMOS-integrated photodetector 340 detects fluorescence from the color centers 326 that couples out of the diamond waveguide 320 from below, while the excitation field (pump pulses) remains guided by the diamond waveguide 320 towards a built-in beam dump (thus providing isolation). Alternatively, any transmitted pump light can be measured on the far end of the diamond waveguide 320, coupled back into the SiN pump waveguide 350, or scattered downward to a CMOS-integrated photodetector 340.

Using Low-Temperature-Enabled High Spin Polarization in Flash-Heated Liquid Samples Cryogenic temperatures are not normally used for chemical NMR because freezing the sample reduces or eliminates the benefit of spin motional narrowing, which can reduce the NMR signal's inhomogeneous linewidth down to the homogeneous NMR linewidth. Fortunately, the benefits of large polarization at low temperature and motional narrowing can be combined through a process of spin polarization and measurement. This process can be applied when the pulse sequence has been running long enough to have reached steady-state in the heating and cooling cycle temperatures.

One way to improve sensitivity is flash-heating the sample. First, the sample is cooled to cryogenic temperatures (frozen), then illuminated with a short, intense pulse of light. This pulse liquefies the sample long enough during the NMR measurement for motional narrowing to occur or the polarization to decrease. The flash heating increases molecular motion in the sample and maintains the benefit of motional narrowing, which improves NMR spectral resolution. And cryogenic conditions yield large polarization of nuclear spins, which improves sensitivity and strengthens NMR signals.

FIG. 4A illustrates simulated nuclear spin magnetization under flash heating and cooling. It shows the sample concentration (left axis) and sample temperature (right axis) versus time. The sample is frozen until 5 seconds, when it is flash-heated and liquefied briefly before re-freezing. This simulation was performed using the chemical species transport module in COMSOL, in which the concentration variable represents magnetization by an analogous equation. The simulation shows that the sample magnetization dips very slightly when the sample is flash-heated.

It takes about 68 ns to heat a sample containing 1 μm³ of water from 4 K to 298 K with a 1-watt power source. It takes about 4 ns for the same sample to cool from 298 K to 4 K after the power is switched off is approximately 4 nanoseconds. Together, the heating and cooling times are significantly shorter than NV center coherence times, meaning that NVs can be used for magnetometry with flash-heated samples.

The sensitivity of an NMR measurement of a liquid sample varies with the polarization of nuclear spins in the liquid sample. The sample's spin lattice relaxation time $T_1$ determines how long it takes the sample to achieve net polarization. When the sample is frozen, there is an exponential relation between $T_1$ and the reciprocal of temperature. $T_1$ increases significantly at lower temperatures, leading to a tension between the magnetization at cryogenic temperatures and the long time it takes to reach this polarization. For short duty cycle experiments (e.g., duty cycles of a few percent), the polarization is roughly at its steady-state, low-temperature value. Reducing the $T_1$ time, e.g., by introducing AC magnetic field noise using the inductors or optical pumping, increases the spin re-polarization rate at low temperature following the measurement.

FIG. 4B shows plots of the temperature (top) and magnetization (bottom) versus time using constants taken from the Arrhenius equation. The magnetization converges to its net value within minutes, indicating a longer than desirable relaxation time when cooling the sample to cryogenic temperatures. This slow relaxation limits how quickly data can be collected and reduces the sensitivity improvement from operating at low temperature.

FIGS. 5A-5C illustrate a three-step process of spin polarization and measurement in a cryogenically cooled sample 113 held in the cavity 112 of a sensing unit cell 110 in a cryostat. This process provides the large polarization associated with low sample temperatures and the spin motional narrowing associated with liquid samples. In the first step, shown in FIG. 5A, a pulse of radiation (e.g., pulse 223 in FIG. 2) flash heats the sample 113 to achieve motional narrowing. More specifically, assuming the sample 113 to be thermalized to temperature $T_{low}$, the pulse of radiation heats a cubic volume of $V_{sens}=(10 \text{ μm})^3$ of sample liquid rapidly from $T_{low-sens}>T_{low}$ to a liquid state at $T_{high}$ through a microwave or laser burst. The duration of this burst scales with the peak microwave or laser power and can be very short (e.g., 100 ns or less) if the peak power is high. Instead of flash heating, motional narrowing may be achieved by spin diffusion from low-temperature environment into the small, heated sensing volume or by moving the frozen liquid using strong phonon drives, such as piezo-actuated ultrasound.

In the second step, shown in FIG. 5B, the sensor performs magnetometry on the motionally narrowed sample 113 for a time T while keeping the sample at $T_{high}$. (To prevent the sample 113 from freezing during this step, the heating pulse may stay on during the magnetometry measurement.) Since the nuclear-spin coherence time $T_2$ is relatively long, the measurement time T can be seconds to minutes.

In the third step, shown in FIG. 5C, the sample 113 is allowed to re-thermalize to $T_{low-sens}$. The rate limitation here is usually the thermalization of the spin instead of the atomic motion. In the extreme of heating and cooling very quickly, $T_{low-sens}$ and $T_{high}$ may settle in at the same value, which is given by the duty cycle and the thermal conductivities of materials around it. Nuclear spin cooling can be promoted from the walls of the sample 113 into the sample 113 by increasing or maximizing the surface contact area of the sample 113. In the limit of a single measurement cycle, the system thermalizes, is measured, and is then allowed to thermalize for a long time again. Then, $T_{low-sens}=T_{low}$ T. This scenario is especially relevant if, for example, one wants to analyze many cells in series by, for example, scanning a diamond NV NMR sensor chip underneath a microscope to screen through cells.

Large Sample Polarization Through a Reservoir of Hyperpolarized Liquid

To speed up the thermalization described above, the nuclear spins can be hyperpolarized by flowing a reservoir of pre-polarized liquid above the chip. The pre-polarized liquid is circulated inside the cryostat between a high-field, low-temperature region and the sensing region of the sensing unit cell. Placing the reservoir and sensing cells close together (e.g., within millimeters of each other) allows rapid liquid exchange, reducing or minimizing depolarization of the reservoir. The reservoir may also be cycled through channels in the IC-diamond chip to polarize those nuclear spins, which then polarize the analyte; in this case, the sample serves as a spin exchange buffer.

FIG. 6 shows a plan view of a sensing unit cell 610 with a reservoir 660 of hyperpolarized liquid 661. This hyperpolarized liquid 661 can be used to rapidly spin-polarize a small-volume sample 613 held in a sample cavity 612 that is connected to the reservoir 660 by a valve 662. To reduce the travel for the hyperpolarized liquid to reach the analyte, the proposed architecture allows the hyperpolarization to be produced immediately adjacent (e.g., within 100 µm) to the analyte cells. Opening the valve 662 allows the hyperpolarized liquid 661 to come in contact with the sample 613, which can be flash-heated by incident heating pulses 631 as described above. This contact between the hyperpolarized liquid 661 and flash-heated sample 613 hyper-polarizes the nuclear spins of the sample 613. Diamond waveguides 622 in a diamond waveguide array 620 guide pump pulses 621 to color centers embedded in the diamond waveguides 622 for ODMR measurements of the hyper-polarized nuclear spins.

Hyperpolarization by Spin Diffusion

The sample can also be hyperpolarized by keeping a small volume of sample at room temperature, surrounded by a low-temperature (e.g., 4 K) substrate. Here, the contact between sample and its surroundings promotes spin diffusion, causing the sample to thermalize as if it were at low temperature, while reducing or minimizing thermal diffusion.

Hyperpolarization by Polarization Transfer from Spin-Polarized Current

A liquid sample at room temperature can be hyperpolarized by running a spin-polarized electronic current through it and transferring polarization from electrons to nuclei using dynamic nuclear polarization techniques. In other words, the polarized electrons in the current polarize the nuclei in the sample, potentially reducing the amplitude of the magnitude of the magnetic field for the NMR measurement. The spin-polarized current can be created using a magnetic semiconductor heterojunction.

In the present NMR measurements, the electron spin polarization is transferred to a liquid (or frozen liquid) sample. One way to transfer the spin polarization to the liquid sample is to use hyperpolarization from the polarized electrons in a semiconductor in contact with the liquid (e.g., the substrate). Another way to transfer the spin polarization to the liquid sample is to inject polarized electrons into the frozen liquid, where they subsequently are made to interact with the nuclear spins to produce hyperpolarization.

FIG. 7A shows a sensing unit cell 710a that uses polarized electrons propagating in a free layer 704 of semiconductor material in contact with a liquid sample 713 to polarize the nuclei (circles with arrows) in the sample 713. The sample 713 is held in a sample chamber 712 formed in a substrate 702. A diamond waveguide 722 with NVs or other color centers 726 extends into the sample 713 for an ODMR measurement as described above. The spins of the color centers 726 are aligned with a magnetic field $B_{external}$ generated by coils or a permanent magnet (not shown). When the sample 713 is flash-heated to a liquid state, spins of electrons (arrows) propagating in the free layer 704 diffuse or tunnel into the liquid sample 713 and polarize the nuclear spins of the sample 713.

FIG. 7B shows a sensing unit cell 710b that uses NVs or other color centers 726 for hyperpolarizing and reading out the nuclei of a sample 713'. Again, a magnetic field $B_{external}$ generated by coils or a permanent magnet (not shown) aligns the spins of the color centers 726. When the sample 713 is flash-heated to a liquid state, the sample nuclei circulate around the diamond waveguides 722 that contain the aligned color centers 726, polarizing the sample nuclei.

Hyperpolarization Through Diamond-to-Liquid Dynamic Nuclear Polarization

The sample may be polarized by passing optically pumped polarization from a diamond-NV material into it: hyperpolarization through dynamic nuclear polarization. In particular, the NV electron polarization is passed to nearby dark spins (e.g., $C^{13}$ nuclei), which then polarize the sample through spin-exchange. This technique can be used without a high external magnetic field and is particularly useful for polarizing near-surface molecules. To promote hyperpolarization, the surface of the diamond waveguide can be patterned: for instance, a quarter-wavelength index modulation furthermore produces a spectral band of slow light in which optical fields have slow group velocity, increasing absorption into the color center (NV). In addition, the slow light effect has associated with it an increased density of optical states, which enhances radiative optical transitions into the waveguide modes (the "Purcell effect"). The consequently improved optical transitions also improve sensing performance.

Magic Angle Spinning of Solid Low-Temperature Samples

Another method of implementing motional narrowing for a cryogenically cooled sample is to subject the sample to a bias magnetic field that rotates with respect to the sample at the "magic angle" of 54.74 degrees. Magic angle spinning averages anisotropy of nuclear interactions and eliminates dependence on orientation, increasing polarization while maintaining narrow NMR lines even when the sample is at low temperatures. In this, chemical shift NMR with motional averaging is achieved in the frozen sample, achieving the full benefit of thermal polarization at low temperature.

FIG. 8 shows a plan view of a sensing unit cell 810 that uses stationary magic angle spinning, where the bias magnetic field rotates about the sample, for motional narrowing in a sample 813 that can be cooled to cryogenic temperatures by placing the sensing unit cell 810 in a cryostat (not shown). The sensing unit cell 810 holds the sample 813 in a cavity 812, with diamond waveguides 822 in a diamond chiplet 820 extending into the sample 813. The ends of the diamond waveguides 822 are tapered to couple pump light to color centers in the diamond waveguides 822 for ODMR measurements of the sample 813. Fluorescence from the color centers can be sensed by an integrated photodetector below or next to the cavity 812.

The sensing unit cell 810 is surrounded on four sides by opposing pairs magnetic field coils 830a-830d, which are concentric with orthogonal axes running through the cavity 812 (e.g., x and y axes). These magnetic field coils 830a-830d can be integrated into the same substrate as the sensing unit cells or separate (e.g., bulk coils that apply the same bias field to all of the sensing unit cells in an array). Permanent magnets (not shown) generate a static magnetic field along an axis going into and out of the plane of FIG. 8 (e.g., the z axis). Each pair of magnetic field coils 830a-830d is driven by a corresponding resonant tank circuit 832a or 832b, which in turn are driven by phase-shifted sinusoidal waveforms from a current source 836 and a 90-degree phase shifter 834. Running the sinusoidal waveforms through the coils 830a-830d produces time-varying magnetic field that adds with the static magnetic field from the permanent magnets to yield a magnetic field that spins about the sample 813 at the magic angle (approximately 54.74°) with respect to the direction of the magnetic field. This magic-angle-spinning magnetic field eliminates magnetic field inhomogeneities by averaging nuclear dipole-dipole interactions to zero.

Efficient Microwave and RF Delivery

Microwave spin NV transitions are at relatively high frequencies. For example, for a 1-Tesla magnetic field, the NV spin ground states are split (largely by the Zeeman effect) to about 30 GHz. Fortunately, the metal loops in the CMOS wiring that make up the microwave coils can be very short (e.g., tens to hundreds of microns), so that even these high-frequency fields are well in the DC limit (i.e., the microwave wavelength, which is on the centimeter-scale, is much shorter than the circuit). In this limit, the Biot-Savart law holds, and several Gauss of RF/microwave magnetic field amplitude is possible with only a few milliamps of current running through the current loops (e.g., current loops 130 in FIGS. 1B and 1C or microwave coils 330 in FIG. 3). Moreover, reflections and other pesky high-frequency effects are avoided. Similar CMOS drivers can be used for efficient NV spin control.

High-Contrast Optical Spin Measurements

At least three measurement modalities are possible in the sensor architectures described above.

First, ODMR under resonant optical excitation of the NV spin-triplet transitions (which targets the NV spin-dependent optical transitions directly) becomes possible at low temperature because the NVs' optical transitions become narrow enough. This technique reduces optical power requirements by more than three orders of magnitude (due to the resonantly strong NV optical absorption) and enables 100% ODMR contrast. As a result, single-shot measurements of NV spins can be routinely performed at low temperature, provided sufficient photon collection.

Second, the present technology can be used for ODMR measurements under resonant transmission of the NV spin-singlet optical transition, which is around 1043 nm. This readout method is in principle possible at room temperature as well, provided a long enough NV-photon interaction time to make up for the otherwise small absorption cross section of the 1043 nm singlet transition.

Third, the present technology can be used for ODMR measurements under resonant transmission through the NV 637 nm line. This absorption line may be reduced when more of the NV population is shelved into the spin-singlet state.

High-Contrast Microwave Readout

An alternative to high-contrast optical readout uses resonant microwave scattering from NV ground state transitions. This approach is similar to electron paramagnetic resonance, with the distinction that the NV spin can be optically polarized/aligned, thus providing a vastly larger net magnetic dipole moment over many NV centers. For example, full spin-dependent extinction contrast can be achieved for a large diamond sample with >$10^{15}$ spins in a bulk diamond sample (millimeter-scale) under strong (>10 Watt) green pumping.

The CMOS architecture disclose here can increase magnetic field overlap with the diamond sample (through the micro-structured current loops), which together with efficient waveguided optical pumping can enable the same near-unity contrast in the microscopic volume of the diamond sensing elements. In this architecture, the dielectric microwave cavity can be replaced with a superconducting LC resonator (enabled uniquely by the low-temperature architecture). Such an LC resonator can operate at 3-100 GHz with a quality factor approaching or exceeding 1,000,000 and a spin-microwave photon coupling rate of about 10 Hz to 1 kHz or higher.

FIGS. 9A and 9B show sensing unit cells 910a and 910b, respectively, each with a superconducting LC resonator 930 that receives a microwave input 931 from a microwave signal source (possibly on the same chip) and transmits a microwave output 933. In both cases, the LC resonator 930 surrounds a sample chamber 912 that holds the sample 913 undergoing the chemical-shift NMR measurement. Both sensing unit cells 910a and 920 use microwave readout. In FIG. 9A, the microwave readout is by spin-dependent optical scattering from optically polarized NV centers in tapered diamond waveguides 922 that extend into the sample 913 and sample chamber 912. The NV centers are polarized with pump pulses 921 from an external laser (not shown). In FIG. 8B, the sensing unit cell 910b performs direct inductive readout from the sample 913. It does not include any color centers or diamond waveguides. Rather, it is used to measure the microwave signal transmitted through or reflected by the LC resonator 930. In both cases, "flash heating" by incident heating pulses 923 still provides for motional narrowing.

Finally, high-contrast readout may alternatively use spin-dependent phonon scattering. In this scheme, a strain transducer launches phonons into the diamond waveguide. These phonons undergo spin-dependent scattering, and the signal is detected by the same or another transducer.

IC-Integrated Microfluidics

As illustrated in FIG. 10, metal layers or select metal wires 1002 in a CMOS substrate 102 can be removed to create channels 1004 for flowing samples into and/or out of sample chambers or spin-polarized liquids used for hyperpolarization into and/or out of reservoirs. These metal wires can be removed by chemical etching or dry etching. In particular, electrochemical etching allows the selective removal of wires that are charged to a given voltage, allowing the formation of intricate volumetric channels.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A nuclear magnetic resonance (NMR) sensor comprising:
   a complementary metal oxide semiconductor (CMOS) substrate;
   a sample chamber, formed in or on the CMOS substrate, to hold a sample;
   a cryostat, in thermal communication with the sample chamber, to cool the sample to a cryogenic temperature; and
   a color center, in electromagnetic communication with the sample, to sense an NMR signal generated by at least one nuclear spin in the sample.

2. The NMR sensor of claim 1, wherein the sample chamber has a volume of no more than 1000 $\mu m^3$.

3. The NMR sensor of claim 1, wherein the sample chamber is in an array of sample chambers formed in or on the CMOS substrate.

4. The NMR sensor of claim 1, wherein the color center is formed in an optical waveguide configured to guide a pump beam to the color center.

5. The NMR sensor of claim 1, further comprising:
a conductive coil, in electromagnetic communication with the color center, to apply a time-varying magnetic field to the color center.

6. The NMR sensor of claim 5, wherein the conductive coil is configured to rotate the time-varying magnetic field at a magic angle with respect to the sample.

7. The NMR sensor of claim 1, further comprising:
a photodetector, in optical communication with the color center, to detect fluorescence emitted by the color center, the fluorescence having a spectrum including a resonance shift caused by the NMR signal.

8. The NMR sensor of claim 1, further comprising:
a radiation source, in electromagnetic communication with the sample, to flash heat at least a portion of the sample.

9. The NMR sensor of claim 1, further comprising:
a microfluidic channel, in fluid communication with the sample chamber, to convey the sample to the sample chamber.

10. The NMR sensor of claim 1, further comprising:
a reservoir to hold a hyperpolarized liquid; and
a valve, in fluid communication with the sample chamber and the reservoir, to admit at least a portion of the hyperpolarized liquid into the sample chamber for hyperpolarizing the sample.

11. A method of measuring nuclear magnetic resonance (NMR) of a sample, the method comprising:
cryogenically cooling a sample in a cavity formed in a substrate;
inducing motional averaging in the sample while applying a magnetic field to the sample; and
performing an optically detected magnetic resonance (ODMR) measurement of a color center disposed in the cavity and at least partially surrounded by the sample, the ODMR measurement representing an alternating current (AC) magnetic field generated by at least one nuclear spin in the sample in response to the magnetic field.

12. The method of claim 11, wherein inducing motional averaging in the sample while applying the magnetic field to the sample comprises flash heating at least a portion the sample.

13. The method of claim 11, wherein inducing motional averaging in the sample while applying the magnetic field to the sample comprises applying the magnetic field as a magic angle spinning magnetic field.

14. The method of claim 11, wherein performing the ODMR measurement comprises:
coupling at least one pump pulse into a waveguide containing the color center and extending into the cavity;
applying a microwave field to the color center; and
measuring fluorescence emitted by the color center in response to the at least one pump pulse and the microwave field.

15. The method of claim 11, further comprising:
hyper-polarizing the sample.

16. The method of claim 15, wherein hyper-polarizing the sample comprises:
flash-heating the sample to a liquid state; and
while the sample is flash-heated to the liquid state, mixing the sample with a pre-polarized liquid.

17. The method of claim 15, wherein hyper-polarizing the sample comprises:
injecting spin-polarized current into the sample.

18. A nuclear magnetic resonance (NMR) sensor comprising:
a substrate; and
an array of sensing unit cells integrated into the substrate, each sensing unit cell in the array of sensing unit cells comprising:
a sample chamber having a volume of no more than 1000 $\mu m^3$ and configured to hold a cryogenically cooled sample having nuclei that emit alternating current (AC) magnetic fields in response to an applied magnetic field;
a waveguide containing a color center and extending into the sample chamber and configured to guide pump light to the color center;
a microwave coil in electromagnetic communication with the sample chamber and configured to apply a microwave field to the color center; and
a photodetector in optical communication with the color center and configured to detect fluorescence emitted by the color center, the fluorescence representing the AC magnetic fields emitted by the nuclei in the cryogenically cooled sample.

19. The NMR sensor of claim 18, further comprising:
a radiation source in optical communication with at least one of the samples and configured to flash-heat the at least one of the samples.

20. The NMR sensor of claim 18, wherein each sensing unit cell in the array of sensing unit cells further comprises:
a reservoir configured to hold a hyperpolarized liquid; and
a valve in fluid communication with the sample chamber and the reservoir and configured to admit the hyperpolarized liquid into the sample chamber for hyperpolarizing the sample.

* * * * *